United States Patent
Van Der Heijden et al.

(10) Patent No.: US 8,119,333 B2
(45) Date of Patent: Feb. 21, 2012

(54) LITHOGRAPHIC METHOD

(75) Inventors: Eddy Cornelis Antonius Van Der Heijden, Netersel (NL); Johannes Anna Quaedackers, Veldhoven (NL); Dorothea Maria Christina Oorschot, Eindhoven (NL); Hieronymus Johannus Christiaan Meessen, Eindhoven (NL); Yin Fong Choi, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 595 days.

(21) Appl. No.: 12/186,959

(22) Filed: Aug. 6, 2008

(65) Prior Publication Data

US 2009/0148796 A1 Jun. 11, 2009

Related U.S. Application Data

(60) Provisional application No. 60/935,586, filed on Aug. 20, 2007.

(51) Int. Cl.
*G03F 7/26* (2006.01)
(52) U.S. Cl. ........................ 430/313; 430/394
(58) Field of Classification Search .................. 430/313, 430/314, 312, 394, 316, 329
See application file for complete search history.

(56) References Cited

U.S. PATENT DOCUMENTS

| | | | |
|---|---|---|---|
| 5,705,319 A | 1/1998 | Bae et al. | |
| 5,902,493 A | 5/1999 | Bae | |
| 6,508,887 B1 | 1/2003 | Park et al. | |
| 6,538,740 B1 | 3/2003 | Shiraishi et al. | |
| 6,569,605 B1 | 5/2003 | Bae | |
| 6,680,164 B2 * | 1/2004 | Nguyen et al. | 430/329 |
| 7,037,626 B2 | 5/2006 | Dirksen et al. | |
| 7,582,413 B2 | 9/2009 | Chen | |
| 7,585,777 B1 * | 9/2009 | Goto et al. | 438/710 |
| 2003/0194647 A1 * | 10/2003 | Huang | 430/271.1 |
| 2005/0153538 A1 * | 7/2005 | Tsai et al. | 438/636 |
| 2006/0163202 A1 * | 7/2006 | Shimizu et al. | 216/67 |
| 2007/0018286 A1 | 1/2007 | Chen | |
| 2008/0009138 A1 * | 1/2008 | Lee | 438/703 |
| 2008/0199814 A1 * | 8/2008 | Brzozowy et al. | 430/312 |
| 2008/0311527 A1 | 12/2008 | Kim et al. | |

FOREIGN PATENT DOCUMENTS

| | | |
|---|---|---|
| JP | 07-235485 A | 9/1995 |
| JP | 09-181059 A | 7/1997 |
| JP | 2001-060003 A | 3/2001 |

(Continued)

OTHER PUBLICATIONS

English language Abstract of Japanese Patent Publication No. 07-235485 A, published Sep. 5, 1995; 1 page.

(Continued)

*Primary Examiner* — Kathleen Duda
*Assistant Examiner* — Caleen Sullivan
(74) *Attorney, Agent, or Firm* — Sterne, Kessler, Goldstein & Fox P.L.L.C.

(57) ABSTRACT

A method for providing a pattern on a substrate is disclosed. The method includes providing a first pattern in a first layer of photoresist and a first layer of bottom anti-reflective coating material on the substrate, etching the first pattern into the substrate, providing a second layer of photoresist and a second layer of bottom anti-reflective coating material on the substrate, providing a second pattern in the second layers of photoresist and bottom anti-reflective coating material, and etching the second pattern into the substrate, the first and second patterns on the substrate together defining the pattern.

20 Claims, 7 Drawing Sheets

FOREIGN PATENT DOCUMENTS

Figure 1A:
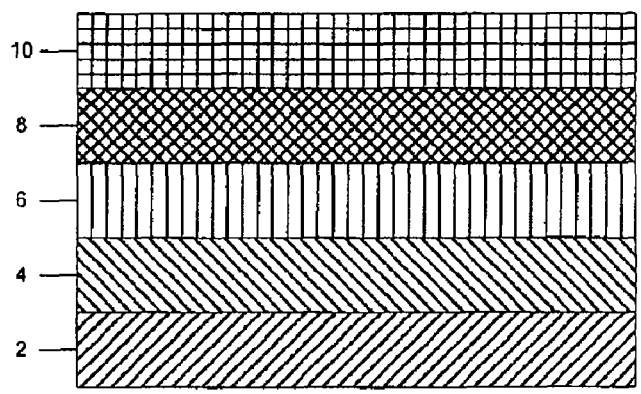

| | | |
|---|---|---|
| JP | 2001-152190 A | 6/2001 |
| JP | 2001-176788 A | 6/2001 |
| JP | 2004-520723 A | 7/2004 |
| JP | 2004-296930 A | 10/2004 |
| JP | 2006-157041 A | 6/2006 |
| JP | 2007-027742 A | 2/2007 |
| JP | 2007-122025 A | 5/2007 |
| JP | 2008-310334 A | 12/2008 |
| JP | 2010-511915 A | 4/2010 |

OTHER PUBLICATIONS

English language Abstract of Japanese Patent Publication No. 09-181059 A, published Jul. 11, 1997; 1 page.

English language Abstract of Japanese Patent Publication No. 2001-060003 A, published Mar. 6, 2001; 1 page.

English language Abstract of Japanese Patent Publication No. 2001-152190 A, published Jun. 5, 2001; 1 page.

English language Abstract of Japanese Patent Publication No. 2001-176788 A, published Jun. 29, 2001; 1 page.

English language Abstract of Japanese Patent Publication No. 2004-296930 A, published Oct. 21, 2004; 1 page.

English language Abstract of Japanese Patent Publication No. 2006-157041 A, published Jun. 15, 2006; 1 page.

English language Abstract of Japanese Patent Publication No. 2007-027742 A, published Feb. 1, 2007; 1 page.

English language Abstract of Japanese Patent Publication No. 2007-122025 A, published May 17, 2007; 1 page.

English language Abstract of Japanese Patent Publication No. 2008-310334 A, published Dec. 25, 2008; 1 page.

Maenhoudt, M.J., et al., "Double Patterning scheme for sub-0.25 k1 single damascene structures at NA=0.75, $\lambda$=193nm," *Proceedings of SPIE* vol. 5754:1508-1518, Optical Microlithography XVIII, edited by Bruce W. Smith (2005).

English translation of Japanese Notice of Reasons for Rejection directed to related Japanese Patent Application No. 2008-208662, the Japanese Patent Office, mailed Mar. 30, 2011; 2 pages.

\* cited by examiner

LITHOGRAPHIC METHOD

CROSS REFERENCE TO RELATED APPLICATIONS

This application claims the benefit of U.S. Provisional Patent Application No. 60/935,586, filed Aug. 20, 2007, which is incorporated by reference herein in its entirety.

BACKGROUND

1. Field of the Invention

The present invention relates to a lithographic method.

2. Background Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti-parallel to this direction.

There is a continuing desire to be able to generate patterns with finer resolution. In general, shorter wavelength radiation may be used in order to achieve a finer resolution pattern.

One method for providing patterns with increased resolution is dual trench patterning where a first pattern of trenches in a hardmask is overlaid by a second interleaved pattern of trenches in the hardmask to provide a final pattern in the hardmask of higher resolution than either the first or second patterns, which is then transferred to a target layer.

FIGS. 1a to 1j show schematically a dual trench patterning method for providing a high resolution pattern. FIG. 1a shows in cross-section a portion of a silicon substrate 2 provided with a target layer 4 of polysilicon material. A hardmask layer 6 is provided on the target layer 4. A first layer of bottom anti-reflective coating (BARC) material 8 is provided on the hardmask layer 6 and a first layer of photoresist 10 is provided on the first layer of BARC material 8. The hardmask layer 6 is typically formed from an oxide material, such as $SiO_2$ or SiON. The photoresist 10 may be any appropriate type of photoresist, such as, but not limited to, positive tone photoresist.

Figure 3:
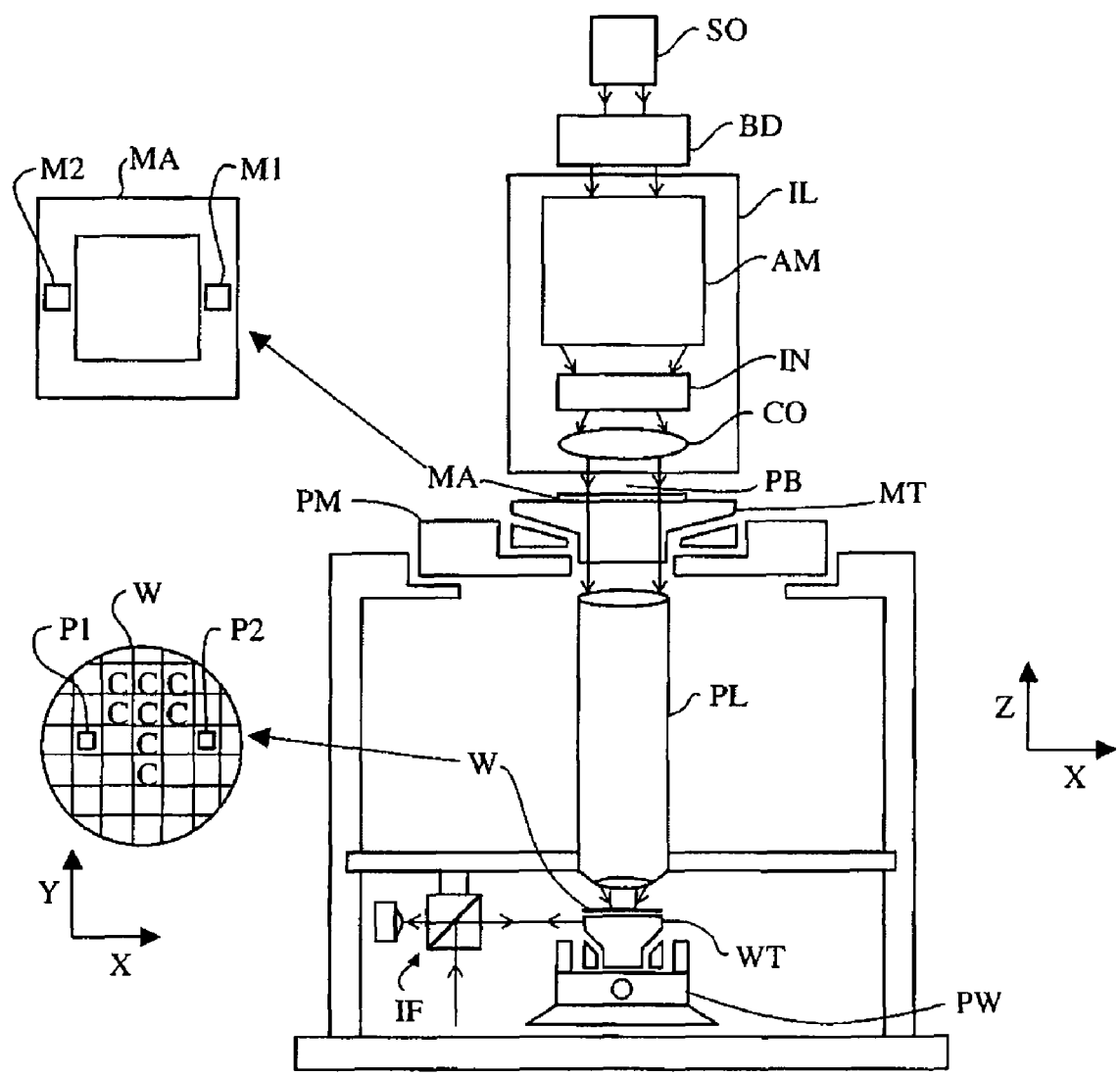

A lithographic apparatus, which may for example be of the type shown schematically in FIG. 3, is used to expose a pattern in the photoresist 10. The exposed photoresist 10 is then removed using a developer, such as a caustic solution containing hydroxide ions, so that only unexposed photoresist 10 remains. The pattern is then transferred to the BARC material 8 using an appropriate etching process, such as an ion etch.

Figure 1B:
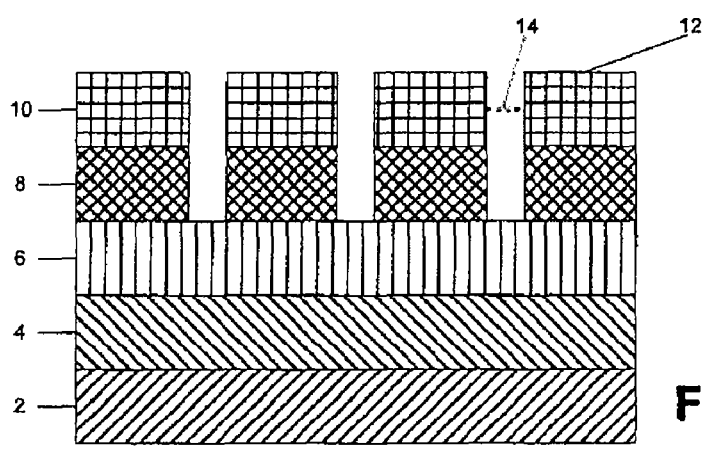

The resulting structure, shown in FIG. 1b, comprises four lines 12 which extend perpendicularly to the plane of FIG. 1b. The full width of each line 12 is three times the width of the space 14 between each pair of lines 12. Only four lines 12 are shown, but it will be appreciated that FIG. 1b shows only a portion of the substrate 2, and that many more lines 12 may be provided on the substrate 2.

Figure 1C:
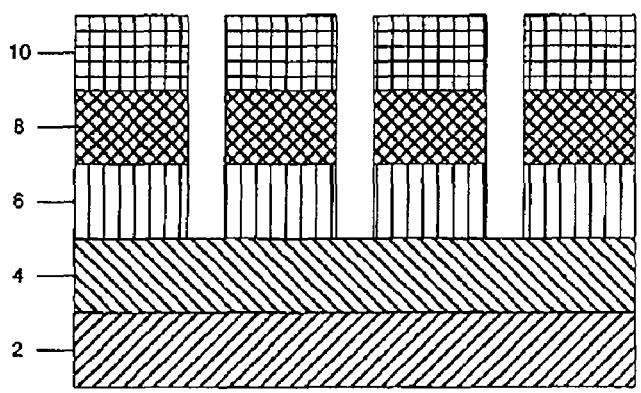
Figure 1D:
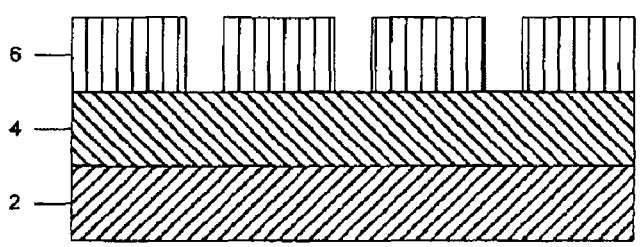
Figure 1E:
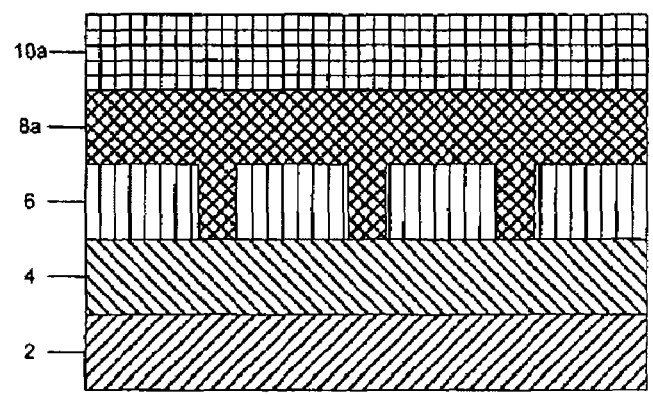
Figure 1F:
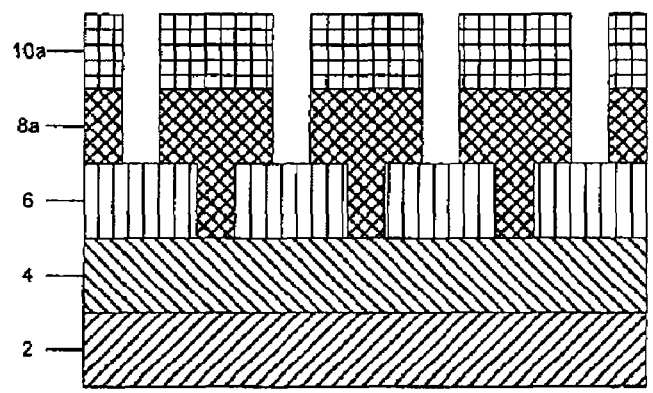
Figure 1G:
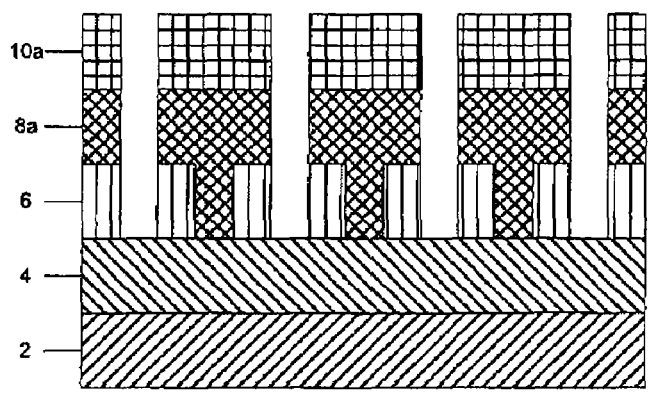

Referring to FIG. 1c, the pattern formed in the photoresist 10 and BARC layer 8 is transferred to the hardmask layer 6 using, for example, a conventional hardmask etching process, such as an ion etch process. Referring to FIG. 1d, the first patterned BARC layer 8 and photoresist layer 10 are removed and then second layers of BARC 8a and photoresist 10a are provided on the patterned hardmask layer 6 as shown in FIG. 1e. A different pattern is then formed in the second layers of BARC 8a and photoresist 10a such that portions of the existing patterned hardmask 6 are uncovered, as shown in FIG. 1f. These uncovered portions of the hardmask 6 are then removed by a conventional etch process to yield the structure shown in FIG. 1g.

Figure 1H:
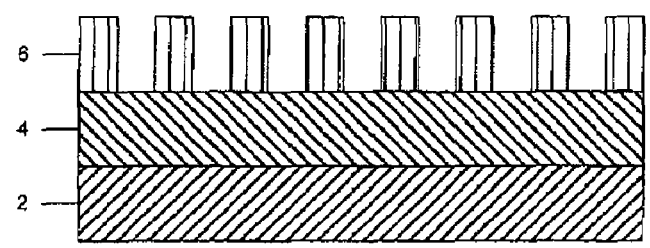
Figure 1I:
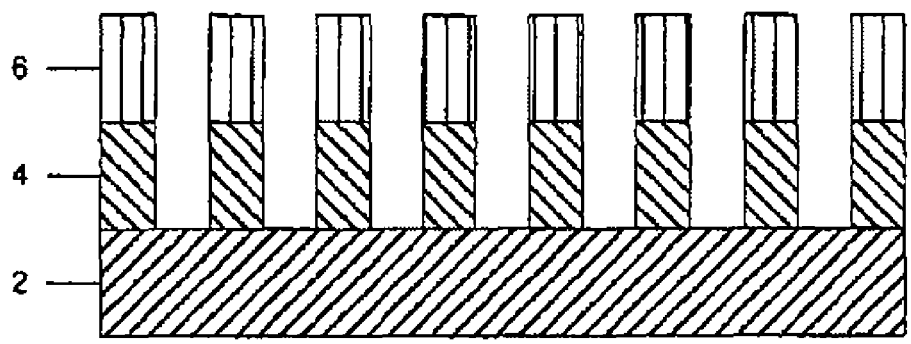
Figure 1J:
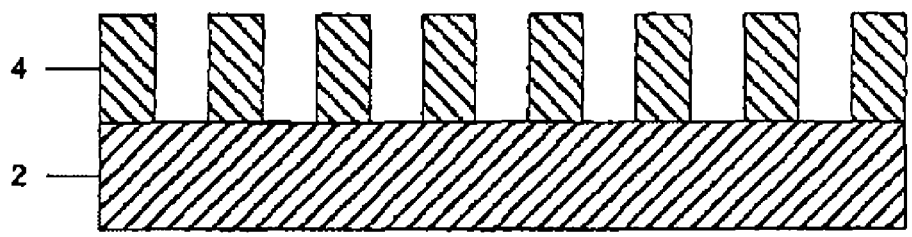

With reference to FIG. 1h, the second BARC 8a and photoresist 10a layers are then removed using a conventional method to leave just the patterned hardmask 6 atop the polysilicon target layer 4. As shown in FIG. 1i, further etching (for example reactive ion etching (RIE)) is used to etch the complete high resolution pattern into the target layer 4. Once this has been done, the residual hardmask 6 is removed, for example using etching, to yield the final structure shown in FIG. 1j.

SUMMARY

The process described above may suffer from a patterning error resulting from one or more different components of the lithographic apparatus, including the patterning device, and/or the method by which the pattern is provided in the various layers of material provided on the substrate. The latter issue is related in part to the different topography of the first and second layers of resist and BARC material. While the first pattern is provided in substantially flat, uniform layers of resist and BARC material provided on a substantially flat hardmask layer, the second pattern is provided in second, less uniform, layers of resist and BARC material deposited on the hardmask layer which now carries the first pattern. Moreover, high temperature deposition of the hardmask layer initially can induce stress in the target and/or substrate layers which may then be relieved by partially removing the hardmask during the first patterning step. As a result, the target and/or substrate layers may deform between the first and second patterning steps, which may lead to pattern overlay errors. Difficulties may therefore be encountered in a high resolution patterning procedure, such as the procedure described above, which results in pattern overlay errors and a consequent loss in patterning accuracy and resolution.

There is a desire to use an alternative technique to achieve patterns with increased resolution. To this end, there is a desire to be able to assess the degree to which the lithographic apparatus contributes to patterning errors, which is, as far as possible, independent of the particular patterning process employed.

According to an aspect of the invention, there is provided a method for providing a pattern on a substrate, the method comprising: providing a first pattern in a first layer of photoresist and a first layer of bottom anti-reflective coating material on the substrate; etching the first pattern into the substrate; providing a second layer of photoresist and a second layer of bottom anti-reflective coating material on the substrate; providing a second pattern in the second layers of photoresist and bottom anti-reflective coating material; and etching the second pattern into the substrate, the first and second patterns on the substrate together defining the pattern.

According to a further aspect of the invention, there is provided a method for testing patterning accuracy of a lithographic apparatus, the method comprising: providing a first pattern in a first layer of photoresist and a first layer of bottom anti-reflective coating material on a substrate; etching the first pattern into the substrate; providing a second layer of photoresist and a second layer of bottom anti-reflective coating material on the substrate; providing a second pattern in the second layers of photoresist and bottom anti-reflective coating material; etching the second pattern into the substrate, the first and second patterns on the substrate together defining a test pattern on the substrate; and analyzing the test pattern provided on the substrate to test the patterning accuracy of the lithographic apparatus.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which:

FIGS. 1a to 1j show schematically a lithographic method;
FIGS. 2a to 2k show schematically a lithographic method according to an embodiment of the invention; and
FIG. 3 depicts schematically a lithographic apparatus which can be used in a method according to an embodiment of the invention.

DETAILED DESCRIPTION

FIGS. 2a to 2k show schematically a dual-line, double patterning method for providing a high resolution pattern in a substrate 2, e.g., a silicon substrate. The patterned substrate can be used to test the fidelity or accuracy of the patterning process by subsequent analysis of the final pattern formed in the substrate 2.

Figure 2A:
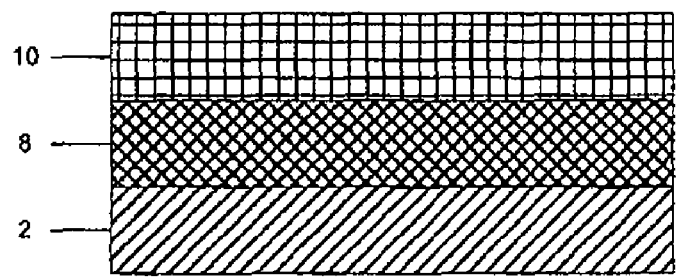
Figure 2B:
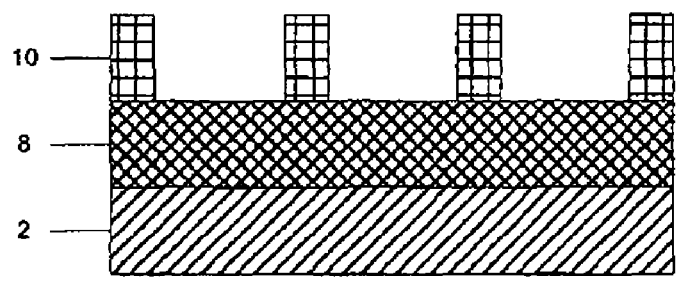

FIG. 2a shows in cross-section a portion of a substrate 2 provided with a layer of bottom anti-reflective coating (BARC) material 8 and photoresist 10. In an embodiment, the BARC material is an organic BARC material and may be any suitable organic BARC material 8 such as, but not limited to, "ARC29" BARC material produced by Brewer Science, Inc. The BARC material 8 may be deposited so as to provide a BARC layer 8 of any appropriate thickness, for example the BARC layer 8 may have a thickness of at least around 35 nm, although a thicker layer of BARC material 8 may be provided. The photoresist 10 may be, for example, a positive tone photoresist, although any appropriate type of photoresist can be used. The photoresist 10 may be selected to be sensitive to radiation at for example, 193 nm or 248 nm A lithographic apparatus, which may for example be of the type shown schematically in FIG. 3, is used to expose a pattern in the photoresist 10. The exposed photoresist 10 is then removed using a developer, such as a caustic solution containing hydroxide ions, so that only unexposed photoresist 10 remains, as shown in FIG. 2b.

Figure 2C:
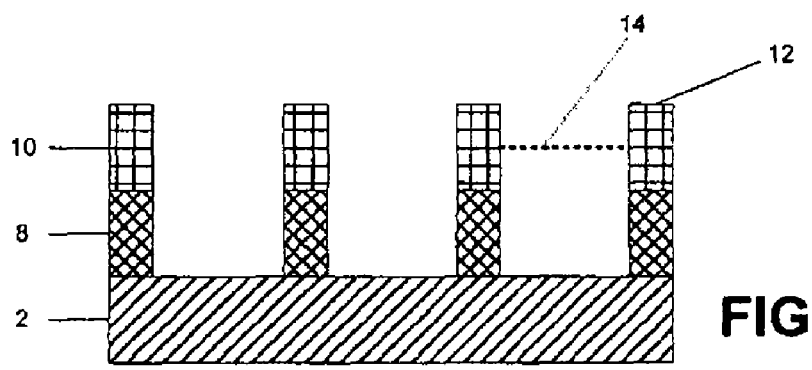

The pattern is then transferred to the BARC material 8 using an appropriate etching process, such as an ion etch, to provide the structure shown in FIG. 2c. The BARC 8 etching process may, for example, employ a plasma comprising argon, oxygen and chlorine (which may involve a slight over etch of the pattern features to ensure that that no material is left in between patterned features that might act as a micro mask during the substrate etch) to both open the BARC layer 8 and trim the patterned features to the desired width. The BARC 8 etching process may be carried out using any convenient instrument, for example, a 711M instrument manufactured by Hitachi High Technologies America, Inc.

The pattern formed in the photoresist layer 10 and BARC layer 8 shown in FIG. 2c comprises four lines 12 that extend perpendicularly to the plane of FIG. 2c. The full width of each line 12 is one-third the width of the space 14 between each pair of lines 12. Only four lines 12 are shown, but it will be appreciated that FIG. 2c shows only a portion of the substrate 2, and that many more lines 12 may be provided on the substrate 2.

Figure 2D:
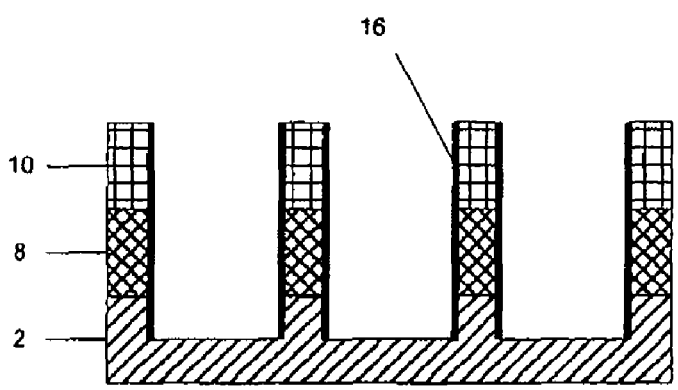

Referring to FIG. 2d, the pattern formed in the photoresist 10 and BARC layer 8 is transferred directly to the substrate 2 using any appropriate silicon etch process, such as reactive ion etching (RIE). The silicon etch process may employ a native oxide etch using a plasma comprising, for example, chlorine and hydrogen bromide and a plasma comprising, for example, oxygen, chlorine and hydrogen bromide, although any appropriate plasma maybe used. Any convenient instrument may be used to carry out the silicon etching process, e.g. a 711M instrument manufactured by Hitachi High Technologies America, Inc.

The plasma that is present during the silicon etch process generates a polymeric material comprising photoresist 10, BARC 8 and silicon halogen compounds which are deposited as a protective polymeric layer 16 along the sidewalls of the patterned stacks incorporating layers of photoresist 10, BARC 8 and substrate 2.

Figure 2E:
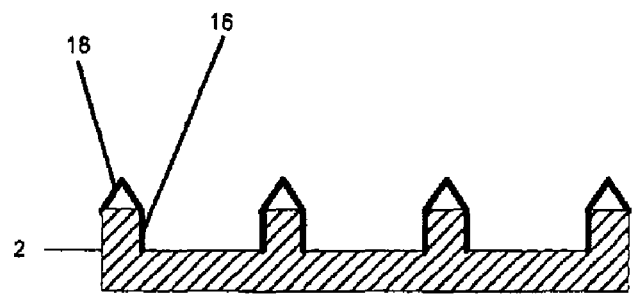

The photoresist 10 and BARC 8 layers are subsequently removed using any appropriate method, for example a solvent base strip or a sulfuric acid peroxide mixture (SPM) strip. A further example is ashing. One non-limiting example of a suitable ashing process employs a plasma comprising oxygen, nitrogen and hydrogen and heating the substrate 2 carrying the patterned photoresist 10 and BARC 8 layers by means of radiation to an elevated temperature, for example a temperature of at least around 200° C., of at least around 250° C., or of around 270° C. Any suitable instrument can be used to carry out the ashing process, e.g. an ES3 instrument manufactured by Axcelis Technologies, Inc. This process does not remove the polymeric sidewall layers 16, which, due to a lack of physical support, collapse towards the exposed uppermost surface of the features formed in the substrate 2, as shown in FIG. 2e, so as to provide further protective polymeric layers 18.

Figure 2F:
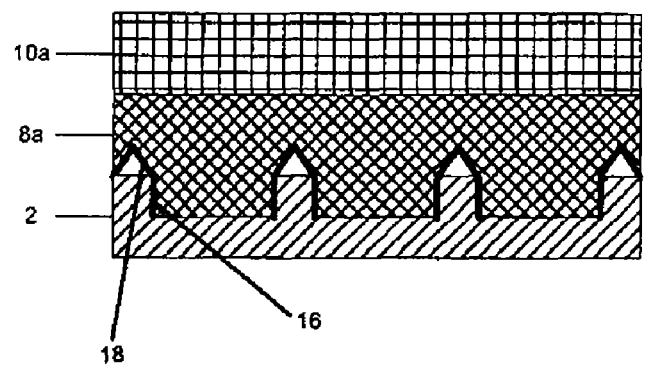
Figure 2G:
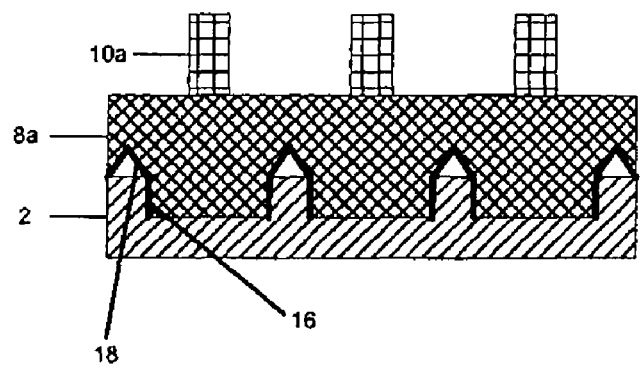

Referring to FIG. 2f, new layers of BARC 8a and photoresist 10a are provided on the patterned substrate 2 carrying its protective polymeric layers 16, 18. Any suitable BARC material 8a may be used, for example, but not limited to, an organic BARC material such as "ARC29" BARC material produced by Brewer Science, Inc. The BARC material 8a may be deposited so as to provide a BARC layer 8a of any appropriate thickness. A desired thickness of the BARC layer 8a depends upon various factors, such as the nature of the photoresist 10a, the substrate 2 and the settings of the lithographic apparatus. The BARC layer 8a may have a thickness of at least around 35 nm. Desirably a thicker layer of BARC material 8a is deposited so as to provide the new layer of BARC material 8a with an upper surface that is as flat as possible and thereby level the topography of the BARC layer 8a, which may contribute to patterning accuracy. For example, the BARC layer 8a may have a thickness of at least around 50 nm, at least around 60 nm or at least around 70 nm. Furthermore, the BARC material 8a may be provided so as to provide a layer of BARC material 8a that is around 40 to 100 nm in thickness, around 55 to 90 nm in thickness, or around 65 to 90 nm in thickness. A desired thickness for the BARC layer 8a is around 85 nm.

A second pattern is then formed in the new layers of photoresist 10a (see FIG. 2g) and BARC 8a (see FIG. 2h), via, for example, exposure of the photoresist 10a, development of the photoresist 10a, and etching of the BARC 8a, to provide a second set of lines 20 in the space 14 between the first set of lines 12, in this way the first and second sets of patterned lines 12, 20 may be considered as being interleaved. The photoresist 10a may be patterned in any convenient way, for example, the same method may be used to form the second pattern as was used to form the first pattern in the photoresist layer 10 described above. The BARC 8 etching process may, by way of example only, employ a plasma comprising argon, oxygen and chlorine (which may involve a slight over etch of the pattern features to ensure that that no material is left in between patterned features that might act as a micro mask during the substrate etch) to both open the BARC layer 8a and trim the patterned features to the desired width. The BARC 8a etching process may be carried out using, for example, a 711M instrument manufactured by Hitachi High Technologies America, Inc. Each second line 20 may be the same width as each first line 12 and each second line 20 may be provided in the center of the space 14 between each pair of first lines 12. In this way, because the spacing 14 between the first lines 12 was three times the width of each first line 12, and thereby, three times the width of each second line 20, the first and second lines 12, 20 may be equal in width and regularly spaced apart by a distance that is equal to the width of each line 12, 20.

Figure 2H:
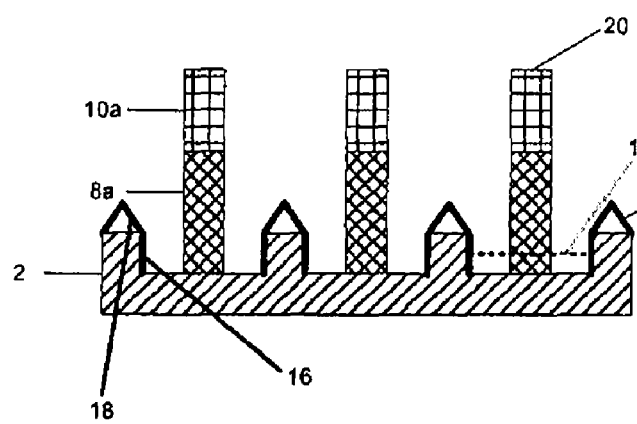
Figure 2I:
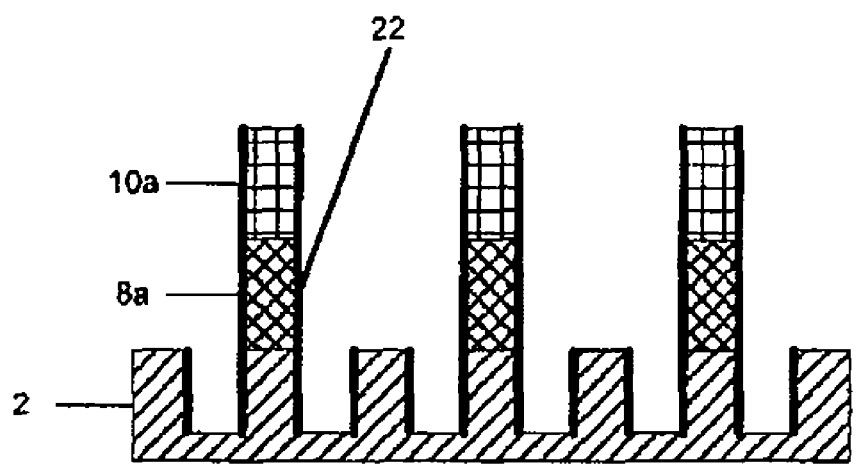
Figure 2J:
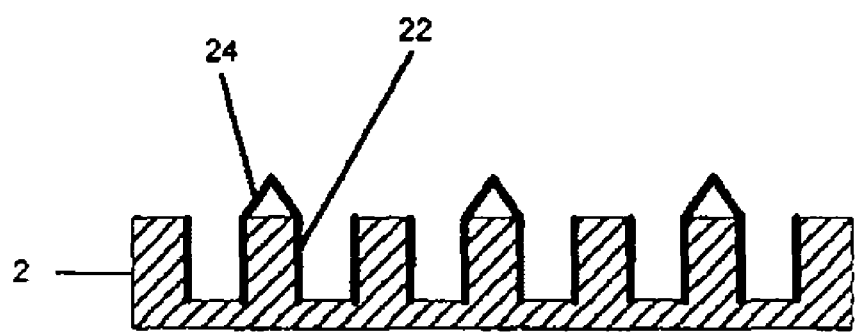

The portions of the existing patterned substrate 2 which are not covered by the patterned photoresist 10a, BARC 8a or polymeric layers 16, 18 (as shown in FIG. 2h) are then removed directly by any appropriate silicon etch process, such as a RIE employing, for example, a native oxide etch using a plasma comprising chlorine and hydrogen bromide and a plasma comprising oxygen, chlorine and hydrogen bromide, to yield the structure shown in FIG. 2i. A 711M instrument manufactured by Hitachi High Technologies America, Inc. may be used to carry out the silicon etching process, although any suitable instrument can be used. During the silicon etching process, further layers of polymeric material 22 are formed and deposited on the sidewalls of the second set of patterned stacks incorporating layers of photoresist 10a, BARC 8a and substrate 2.

The photoresist and BARC layers 10a, 8a are then removed by any convenient means, such as a solvent base strip, a sulfuric acid peroxide mixture (SPM) strip, or ashing. A non-limiting example of a suitable ashing process employs a plasma comprising oxygen, nitrogen and hydrogen and heating the substrate 2 carrying the patterned photoresist 10a and BARC 8a layers by means of radiation to an elevated temperature, for example a temperature of at least around 200° C., of at least around 250° C., or around 270° C. A non-limiting example of a suitable instrument that can be used to carryout the ashing process is an AXCELIS ES3 instrument. This ashing process causes regions 24 of the polymeric sidewall layers 22 to collapse onto the substrate 2 features to provide the structure shown in FIG. 2j.

Figure 2K:
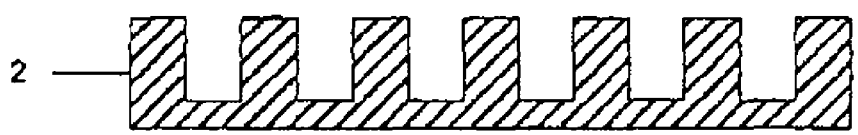

The protective polymeric layers 16, 22, 24 provided on patterned features of the substrate 2 are then removed to yield the final patterned silicon substrate 2 as shown in FIG. 2k. A convenient method for removing the protective polymeric layers 16, 22, 24 is a wet strip process, for example a hydrofluoric acid strip process, optionally also employing hydrogen peroxide, which may be carried out using, for example, a FSI Mercury instrument. The substrate 2 now carries a high resolution test pattern that can be analyzed using any conventional means to determine the resolution of the test pattern and the accuracy of the patterning process. In this way, an embodiment of the invention may be used to determine patterning accuracy and overlay characteristics of the lithographic apparatus and thereby used to calibrate an apparatus for use in a high resolution patterning procedure.

A method according to an embodiment of the invention may obviate or mitigate at least one or more of the disadvantages associated with the process described in relation to FIGS. 1a to 1j. A method according to an embodiment of the invention removes the need to use a hardmask material which significantly reduces material costs. The complicated, time consuming and costly processes need to pattern and subsequently remove hardmask materials may therefore no longer be required. One or more problems related to over-etching and under-cutting of features during the patterning process may also be removed which avoids the possibility of such reducing patterning fidelity.

An advantage of a method according to an embodiment of the invention is that one or more of the problems discussed above relating to stress-induced deformation of the substrate layer between the first and second patterning steps may be reduced because of the removal of the hardmask layer. Accordingly, a method according to an embodiment of the invention enables the contribution to patterning errors associated with the lithographic apparatus to be assessed in the absence of any contribution to such errors from the hardmask, which represents a significant advance over methods employing a hardmask.

FIG. 3 schematically depicts a lithographic apparatus which can be used in a method according to a particular embodiment of the invention. An illumination system (illuminator) IL is configured to condition a beam PB of radiation (e.g. UV radiation or DUV, such as for example generated by an excimer laser operating at a wavelength of 193 nm or 157 nm, or EUV radiation, such as for example generated by a laser-fired plasma source operating at 13.6 nm). A support structure (e.g. a mask table) MT is configured to support a patterning device (e.g. a mask) MA and is connected to a first positioning device PM to accurately position the patterning device with respect to a projection lens PL.

A substrate table (e.g. a wafer table) WT is configured and arranged to hold a substrate (e.g. a photoresist-coated wafer) W and is connected to a second positioning device PW configured and arranged to accurately position the substrate with respect to projection lens PL. A projection system including, for example, a refractive projection lens, such as projection lens PL is configured and arranged to image a pattern imparted to the radiation beam PB by patterning device MA onto a target portion C (e.g. comprising one or more dies) of the substrate W. In the FIG. 3 embodiment, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising for example suitable directing mirrors and/or a beam expander. In other cases the source may be integral part of the apparatus, for example when the source is a mercury lamp. The source SO and the illuminator IL, together with the beam delivery system BD if required, maybe referred to as a radiation system.

The illuminator IL may comprise adjusting means AM for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally comprises various other components, such as an integrator IN and a condenser CO. The illuminator provides the conditioned beam of radiation PB, having a desired uniformity and intensity distribution in its cross-section.

The radiation beam PB is incident on the patterning device (e.g. mask) MA, which is held on the support structure MT. Having traversed the patterning device MA, the beam PB passes through the projection system PL, which focuses the beam onto target portion C of the substrate W. With the aid of the second positioning device PW and position sensor IF (e.g. an interferometric device), the substrate table WT can be moved accurately, e.g. so as to position different target portions C in the path of the beam PB. Similarly, the first positioning device PM and another position sensor (which is not explicitly depicted in FIG. 3) can be used to accurately position the patterning device MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The materials used in the examples described above in relation to FIGS. 1 and 2 are given as examples only. Other materials may be used. Although the described embodiments refer to trenches and lines, an embodiment of the invention maybe used to form other structures. Although the apparatus and method described above according to an embodiment of the invention are discussed in relation to providing a test pattern in a substrate which can be analyzed to determine patterning overlay errors, it should be appreciated that the patterning method is applicable to patterning a substrate for any desirable purpose and is not necessarily limited just to providing a pattern for purely analytical purposes.

Where specific reference has been made above to the use of the lithographic apparatus in the manufacture of ICs, but it should be understood that the method described herein may be applied to the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to, collectively or singularly, as a "lens".

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

The lithographic apparatus may also be of a type wherein the substrate is immersed in a liquid having a relatively high refractive index, e.g. water, so as to fill a space between the final element of the projection system and the substrate. Immersion techniques are well known in the art for increasing the numerical aperture of projection systems.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A method for forming an integrated circuit pattern, the method comprising:
   providing a first layer of photoresist and a first layer of bottom anti-reflective coating material on a substrate without a masking layer between the substrate and the first layer of bottom anti-reflective coating material;
   providing a first pattern in the first layer of photoresist and the first layer of bottom anti-reflective coating material;
   etching the first pattern;
   providing a second layer of photoresist and a second layer of bottom anti-reflective coating material on the substrate;
   providing a second pattern in the second layers of photoresist and bottom anti-reflective coating material; and
   etching the second pattern, the first and second patterns on the substrate together defining the integrated circuit pattern.

2. The method of claim 1, wherein the bottom anti-reflective coating material is an organic bottom anti-reflective coating material.

3. The method of claim 1, wherein the first layer of bottom anti-reflective material, or the second layer of bottom anti-reflective coating material, or the first and second layers of bottom anti-reflective material, have a thickness selected from the group consisting of at least around 35 nm, at least around 50 nm, at least around 60 nm, at least around 70 nm and around 85 nm.

4. The method of claim 1, wherein the first layer of photoresist, or the first layer of bottom anti-reflective coating material, or the first layer of photoresist and the first layer of bottom anti-reflective coating material, are removed from the substrate before the second layer of photoresist, or the second layer of bottom anti-reflective coating material, or the second layer of photoresist and the second layer of bottom anti-reflective coating material, is provided.

5. The method of claim 1, wherein the first pattern, or the second pattern, or the first and second patterns, is etched using reactive ion etching.

6. The method of claim 1, wherein the first pattern, or the second pattern, or the first and second patterns, is etched using a plasma comprising oxygen, chlorine and hydrogen bromide.

7. The method of claim 1, wherein after the first pattern, or the second pattern, or the first and second patterns, has been etched, residual photoresist, or residual bottom anti-reflective coating material, or the residual photoresist and residual bottom anti-reflective coating material, is removed.

8. The method of claim 7, wherein the residual photoresist, or the residual bottom anti-reflective coating material, or the residual photoresist and the residual bottom anti-reflective coating material, is removed by ashing.

9. The method of claim 8, wherein the ashing comprises using a plasma.

10. The method of claim 9, wherein the plasma comprises oxygen, nitrogen and hydrogen.

11. The method of claim 8, wherein the ashing comprises heating the residual photoresist, or the residual bottom anti-reflective coating material, or the residual photoresist and the residual bottom anti-reflective coating material, to a temperature selected from the group consisting of at least around 200° C., at least around 250° C., and around 270° C.

12. The method of claim 8, wherein the residual photoresist, or the residual bottom anti-reflective coating material, or the residual photoresist and the residual bottom anti-reflective coating material, is removed and a layer of polymeric material is deposited.

13. The method of claim 12, wherein the layer of polymeric material is removed by wet strip after the second pattern has been etched.

14. The method of claim 13, wherein the wet strip comprises a hydrofluoric acid stripping process.

15. The method of claim 1, wherein the first pattern, or the second pattern, or the first pattern and the second pattern, comprises a series of lines.

16. The method of claim 1, wherein the second pattern is interleaved with the first pattern such that the integrated circuit pattern has a higher resolution than either the first pattern or the second pattern.

17. The method of claim 1, wherein the substrate comprises a silicon substrate.

18. A method for testing patterning accuracy of a lithographic apparatus, the method comprising:
   providing a first layer of photoresist and a first layer of bottom anti-reflective coating material on a substrate without a masking layer between the substrate and the first layer of bottom anti-reflective coating material;

providing a first pattern in the first layer of photoresist and the first layer of bottom anti-reflective coating material;

etching the first pattern;

providing a second layer of photoresist and a second layer of bottom anti-reflective coating material;

providing a second pattern in the second layers of photoresist and bottom anti-reflective coating material;

etching the second pattern, the first and second patterns together defining a test pattern; and analyzing the test pattern to test the patterning accuracy of the lithographic apparatus.

19. The method of claim 18, wherein the bottom anti-reflective coating material is an organic bottom anti-reflective coating material.

20. The method of claim 18, wherein the first pattern, or the second pattern, or the first and second patterns, is etched using reactive ion etching.

* * * * *